(12) United States Patent
Li et al.

(10) Patent No.: US 11,588,047 B2
(45) Date of Patent: Feb. 21, 2023

(54) SEMICONDUCTOR COMPONENT AND MANUFACTURING METHOD THEREOF

(71) Applicant: INNOSCIENCE (ZHUHAI) TECHNOLOGY CO., LTD., Zhuhai (CN)

(72) Inventors: Hao Li, Zhuhai (CN); Haoning Zheng, Zhuhai (CN); Anbang Zhang, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 176 days.

(21) Appl. No.: 16/989,871

(22) Filed: Aug. 10, 2020

(65) Prior Publication Data

US 2021/0384338 A1    Dec. 9, 2021

(30) Foreign Application Priority Data

Jun. 4, 2020 (CN) .......................... 202010499377.1

(51) Int. Cl.
  *H01L 29/778* (2006.01)
  *H01L 29/40* (2006.01)
  *H01L 29/66* (2006.01)

(52) U.S. Cl.
  CPC ........ *H01L 29/7786* (2013.01); *H01L 29/404* (2013.01); *H01L 29/66462* (2013.01)

(58) Field of Classification Search
  CPC ............... H01L 29/7786; H01L 29/404; H01L 29/66462; H01L 29/2003; H01L 29/41766; H01L 29/407; H01L 29/7781
  See application file for complete search history.

(56) References Cited

U.S. PATENT DOCUMENTS

| | | | |
|---|---|---|---|
| 9,306,012 B2 | 4/2016 | Su et al. | |
| 9,666,664 B2 | 5/2017 | Kajitani et al. | |
| 2016/0190297 A1* | 6/2016 | Kudymov | H01L 29/205 257/76 |
| 2021/0218394 A1* | 7/2021 | Kuraguchi | H03K 17/223 |

OTHER PUBLICATIONS

Zhang Kai et al., "Field plate structural optimization for enhancing the power gain of GaN-based HEMTs", Chinese Physics B, 2013, vol. 22, No. 9.

* cited by examiner

*Primary Examiner* — Douglas W Owens

(74) *Attorney, Agent, or Firm* — Idea Intellectual Limited; Margaret A. Burke; Sam T. Yip

(57) ABSTRACT

The present disclosure discloses a semiconductor component and a method for forming the semiconductor component. The semiconductor component includes a substrate, a III-V layer, a doped III-V layer, a gate contact, a first field plate, and a second field plate. The gate contact has first and second sides away from the doped III-V layer. The first field plate has first and second sides, and the first side is closer to the second side of the gate contact than the second side. The second field plate has first and second sides, and the first side is closer to the second side of the gate contact than the second side. The first field plate is closer to the doped III-V layer than the second field plate and the first side and the second side of the gate contact.

26 Claims, 13 Drawing Sheets

SEMICONDUCTOR COMPONENT AND MANUFACTURING METHOD THEREOF

TECHNICAL FIELD

The present disclosure relates to a semiconductor component and a manufacturing method thereof, and more particularly to a radio frequency semiconductor component with field plates and a manufacturing method of the radio frequency semiconductor component.

BACKGROUND

Components including direct bandgap semiconductors, such as a semiconductor component including Group III-V compounds, may be operated or work in a variety of conditions or environments (such as different voltages or frequencies) due to their characteristics.

The above semiconductor components may include a heterojunction bipolar transistor (HBT), a heterojunction field effect transistor (HFET), a high-electron-mobility transistor (HEMT), or a modulation-doped FET (MODFET) and the like.

SUMMARY

Some embodiments of the present disclosure provide a semiconductor component, including a substrate, a III-V layer, a doped III-V layer, a gate contact, a first field plate, and a second field plate. The III-V layer is disposed on the substrate. The doped III-V layer is disposed on the III-V layer. The gate contact is directly located on the doped III-V layer, and the gate contact has a first side and a second side both away from the doped III-V layer. The first field plate has a first side and a second side, and the first side of the first field plate is closer to the second side of the gate contact than the second side. The second field plate has a first side and a second side, and the first side of the second field plate is closer to the second side of the gate contact than the second side. The first field plate is closer to the doped III-V layer than the second field plate and the first side and the second side of the gate contact.

Some embodiments of the present disclosure provide a method for forming a semiconductor component. The method includes: providing a substrate; forming a III-V layer on the substrate; forming a doped III-V layer on the III-V layer; forming a first field plate having a first side and a second side; after forming the first field plate, directly forming a gate contact on the doped III-V layer, the gate contact having a first side and a second side both away from the doped III-V layer, the first side of the first field plate being closer to the second side of the gate contact than the second side; and after forming the gate contact, forming a second field plate having a first side and a second side, the first side being closer to the second side of the gate contact than the second side.

BRIEF DESCRIPTION OF THE DRAWINGS

The aspects of the present disclosure will become more comprehensible from the following detailed description made with reference to the accompanying drawings. It should be noted that, various features may not be drawn to scale. In fact, the sizes of the various features may be increased or reduced arbitrarily for the purpose of clear description.

DETAILED DESCRIPTION

Figure 1:
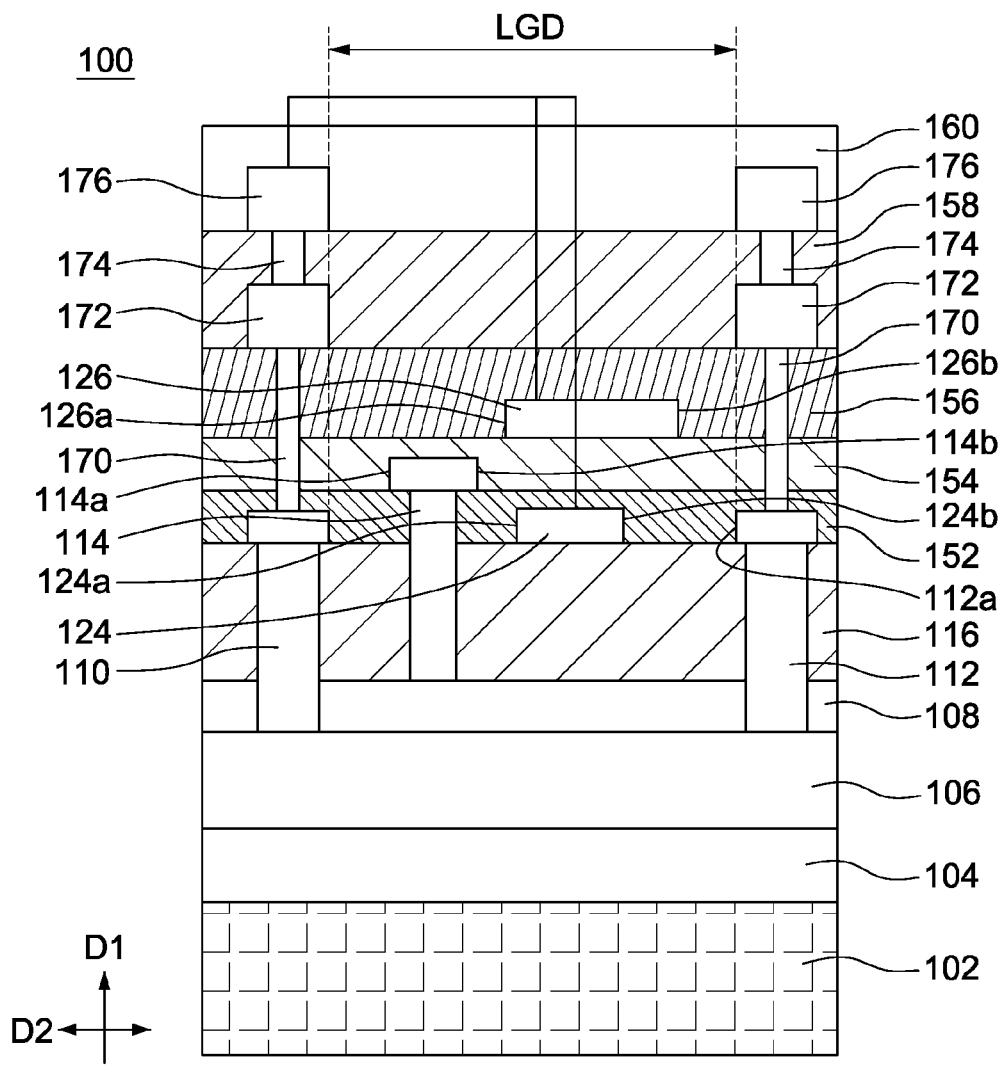
FIG. 1 shows a sectional view of a semiconductor component according to some embodiments of the present disclosure.

The following disclosure provides many different embodiments or examples for implementing different features of the provided subject matter. Specific examples of components and arrangements are described below. Certainly, these descriptions are merely examples and are not intended to be limiting. In the present disclosure, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in the present disclosure, reference numerals and/or letters may be repeated in examples. This repetition is for the purpose of simplification and clarity, and does not indicate a relationship between the described various embodiments and/or configurations.

The embodiments of the present disclosure are described in detail below. However, it should be understood that many applicable concepts provided by the present disclosure may be implemented in a plurality of specific environments. The described specific embodiments are only illustrative and do not limit the scope of the present disclosure.

FIG. 1 shows a semiconductor component 100 according to some embodiments of the present disclosure.

As shown in FIG. 1, the semiconductor component 100 may include a substrate 102, a III-V layer 106, a doped III-V layer 108, a gate contact 114, a field plate 124, and a field plate 126.

The substrate 102 may include, for example, but is not limited to, silicon (Si), doped silicon (doped Si), silicon carbide (SiC), germanium suicide (SiGe), gallium arsenide (GaAs), or other semiconductor materials. The substrate 102 may include, for example, but is not limited to, sapphire, silicon on insulator (SOI), or other suitable materials.

The III-V layer 106 is disposed on the substrate 102. The III-V layer 106 may include, for example, but is not limited to, a III nitride, such as a compound $In_xAl_yGa_{1-x-y}N$, where $x+y \le 1$. The III nitride may also include, for example, but is not limited to, a compound $Al_yGa_{(1-y)}N$, where $y \le 1$. In some embodiments, the III-V layer 106 may include a GaN layer, and GaN may have a bandgap of about 3.4 eV. In some embodiments, the thickness of the III-V layer 106 is between, but not limited to, about 0.5 μm and about 10 μm.

The doped III-V layer 108 is disposed on the III-V layer 106. The doped III-V layer 108 may include, for example, but is not limited to, doped gallium nitride (doped GaN), doped aluminum gallium nitride (doped AlGaN), doped indium gallium nitride (doped InGaN), and other doped III-V compounds. The doped III-V layer 108 may include, for example, but is not limited to, a p-type dopant, an n-type dopant, or other dopants. In some embodiments, the exemplary dopants may include, for example, but are not limited to, magnesium (Mg), zinc (Zn), cadmium (Cd), silicon (Si), germanium (Ge), and the like. Compared to the III-V layer 106, the doped III-V layer 108 may have a relatively large bandgap. For example, the III-V layer 106 may include a GaN layer, and GaN may have a bandgap of about 3.4 eV. The doped III-V layer 108 may include AlGaN, and AlGaN may have a bandgap of about 4.0 eV. A two-dimensional electron gas (2DEG) region is usually formed in a layer (for example, GaN) with a relatively small bandgap. A heterojunction is formed between the III-V layer 106 and the doped III-V layer 108, and the polarizations of the heterojunctions of different nitrides form the 2DEG region in the III-V layer 106. The III-V layer 106 may supply or remove electrons in the 2DEG region, and thus may control the conduction of the semiconductor component 100.

The gate contact 114 is located on the doped III-V layer 108. The gate contact 114 has a side 114a and a side 114b both away from the doped III-V layer 108. The gate contact 114 may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo), and compounds thereof (such as, but not limited to, titanium nitride (TiN), tantalum nitride (TaN), other conductive nitrides, or conductive oxides, metal alloys (such as aluminum-copper alloys (Al—Cu)), or other suitable materials.

The doped III-V layer 108 may be in direct contact with the gate contact 114. The doped III-V layer 108 may be electrically connected to the gate contact 114. The doped III-V layer 108 is located below the gate contact 114 in a direction D1. The gate contact 114 is located above the doped III-V layer 108 in the direction D1.

The semiconductor component 100 may further include a buffer layer 104 disposed on the substrate 102. The buffer layer 104 may be located between the III-V layer 106 and the substrate 102. In some embodiments, the buffer layer may include (but is not limited to) nitrides, such as aluminum nitride (AlN) and aluminum gallium nitride (AlGaN). In some embodiments, the buffer layer may be used to improve lattice match between the substrate 102 and a superlattice layer (not shown in the figure).

In some embodiments, the semiconductor component 100 may further include a superlattice layer (not shown in the figure) disposed between the buffer layer 104 and the III-V layer 106. The superlattice layer may include a single-layer structure. The superlattice layer may include a multi-layer structure or a multi-layer stack, such as a multi-layer stack of AlN/GaN pairs. In some embodiments, the superlattice layer may reduce the tensile stress of the semiconductor component 100. In some embodiments, the superlattice layer may trap electrons diffused from the substrate 102 to the III-V layer 106, thereby improving the performance and reliability of the device. In some embodiments, the superlattice layer may reduce electron traps. In some embodiments, the superlattice layer may increase the thickness of the III-V layer 106. In some embodiments, the superlattice layer may increase a breakdown voltage.

In order to prevent defects (such as dislocations) from propagating from the lower layers (such as the substrate 102 and the buffer layer 104) to the III-V layer 106, the superlattice layer may be added between the substrate 102 and the III-V layer 106 to avoid the dysfunction of the semiconductor component 100.

The semiconductor component 100 may also include other conductive structures. For example, the semiconductor component 100 may further include a source contact 110, a drain contact 112, or other conductive structures disposed on the substrate 102. Although the source contact 110 and the drain contact 112 are respectively disposed on both sides of the gate contact 114 in FIG. 1, the source contact 110, the drain contact 112, and the gate contact 114 may have different configurations in other embodiments in the present disclosure due to design requirements.

In some embodiments, the source contact 110 and the drain contact 112 may include, for example, but are not limited to, conductive materials. The conductive materials may include, for example, but are not limited to, metals, alloys, doped semiconductor materials (such as doped crystalline silicon) or other suitable conductive materials.

Part of the source contact 110 may be located in the doped III-V layer 108. Part of the drain contact 112 may be located in the doped III-V layer 108. In some other embodiments, the source contact 110 may be disposed on the III-V 106. In some other embodiments, the drain contact 112 may be disposed on the III-V 106.

The semiconductor component 100 may further include a field plate 124 and a field plate 126. The field plate 124 and the field plate 126 are not in contact with each other. The field plate 124 and the field plate 126 are separated from each other. The field plate 124 may be at a zero potential. The field plate 126 may be at a zero potential. Although the semiconductor component 100 depicted in the drawing of the present disclosure has the two field plates, the present disclosure is not limited to this. In some embodiments, the semiconductor component 100 may include more or less than two field plates. Increasing of the number of the field plates may adjust the surface electric field distribution step by step. The change of the thickness and the enlargement of the coverage area of the field plates may reduce the resistance and lower the loss of a radio frequency signal. The field plate 124 may be connected to the source contact 110 and/or the drain contact 112 via other conductive structures. The field plate 126 may be connected to the source contact 110 and/or the drain contact 112 via other conductive structures. As shown in FIG. 1, the field plate 124 is not in direct contact with the source contact 110. The field plate 124 is not in direct contact with the drain contact 112. The field plate 126 is not in direct contact with the source contact 110. The field plate 126 is not in direct contact with the drain contact 112.

The field plate 124 has a side 124a and a side 124b. The side 124a of the field plate 124 is closer to the gate contact 114 than the side 124b. The field plate 126 has a side 126a and a side 126b. The side 126a of the field plate 126 is closer to the gate contact 114 than the side 126b. The field plate 124 is closer to the doped III-V layer 108 than the field plate 126 and the side 114a and the side 114b of the gate contact 114.

In some embodiments, the gate contact 114 does not overlap the field plate 124 from its side 114a to its side 114b. In other words, in the direction D1, the field plate 124 does not cover the gate contact 114. Due to the design that the field plate 124 is closer to the doped III-V layer 108 than the side 114a and the side 114b of the gate contact 114, and the gate contact 114 does not overlap the field plate 124 from its side 114a to its side 114b, a short circuit between the gate contact 114 and the field plate 124 can be effectively avoided.

In some embodiments, the side 126a of the field plate 126 does not extend beyond the side 124a of the field plate 124. In some other embodiments, the side 126a of the field plate 126 extends beyond the side 124a of the field plate 124. Compared to the aforementioned embodiments, since the side 126a of the field plate 126 extends beyond the side 124a of the field plate 124, an electric field peak generated near the side 124a of the field plate 124 can be effectively suppressed by the field plate 126.

In some embodiments, a distance from a bottom of the field plate 124 to the doped III-V layer 108 is 50 to 200 nm. In some embodiments, the height of the field plate 124 is 50 to 300 nm. In some embodiments, the width of the field plate 124 is ⅕ to ½ $L_{GD}$. The $L_{GD}$ is a distance from a right side of the source contact 110 to a left side of the drain contact 112. In some embodiments, the height of the field plate 126 is 50 to 300 nm. In some embodiments, a distance from a bottom of the field plate 126 to a top of the gate contact 114 is greater than 100 nm. In some embodiments, the width of the field plate 126 is ¼ to ¾ $L_{GD}$.

The semiconductor component 100 may further include a passivation layer 116 disposed on the doped III-V layer 108. In some embodiments, the passivation layer 116 may include, for example, but is not limited to, oxides or nitrides, such as silicon nitride (SiN) and silicon dioxide ($SiO_2$). The passivation layer 116 may include, for example, but is not limited to, a composite layer of an oxide and a nitride, such as $Al_2O_3$/SiN, $Al_2O_3$/$SiO_2$, AlN/SiN, AlN/$SiO_2$, and so on.

The passivation layer 116 may surround or partially surround the gate contact 114. The passivation layer 116 may surround or partially surround the source contact 110. The passivation layer 116 may surround or partially surround the drain contact 112.

The semiconductor component 100 further includes a passivation layer 152 disposed on the passivation layer 116 and covering the field plate 124. The passivation layer 152 may surround or partially surround the gate contact 114. The passivation layer 152 may surround or partially surround the source contact 110. The passivation layer 152 may surround or partially surround the drain contact 112. The passivation layer 152 may surround or partially surround the field plate 124.

The semiconductor component 100 further includes a passivation layer 154 disposed on the passivation layer 152 and covering the gate contact 114. The passivation layer 154 may surround or partially surround the gate contact 114.

The semiconductor component 100 further includes a passivation layer 156 disposed on the passivation layer 154 and covering the field plate 126. The passivation layer 156 may surround or partially surround the field plate 126.

The semiconductor component 100 may further include an interconnect structure 170. The semiconductor component 100 may further include a metal layer 172 and a metal layer 176. The semiconductor component 100 further includes a conductive via 174.

The III-V layer 106 may have an electronic channel region 106a as illustrated by a dotted line. The electronic channel region 106a may include the 2DEG region. The 2DEG region is generally easily obtained in a heterostructure. In the 2DEG region, electron gas may move freely in a two-dimensional direction (such as a direction D2), and is suppressed in a three-dimensional direction (such as the direction D1).

The III-V layer 106 may include a single-layer structure. The III-V layer 106 may include a multi-layer structure. The III-V layer 106 may include the heterostructure.

In some embodiments, since the III-V layer 106 has generated an actual channel (the electronic channel region 106a) below the gate contact 114, the gate contact 114 is preset to an ON state when it is in a zero-bias state. Such a device may also be called a depletion mode device.

The field plate 124 may reduce a parasitic capacitance $C_{GD}$ between the gate contact 114 and the drain contact 112. In some embodiments, the closer the field plate 124 is to the doped III-V layer 108, the more it can affect the 2DEG region and change the distribution of the 2DEG. More specifically, the closer the field plate 124 is to the doped III-V layer 108, the more it can reduce the 2DEG density of the side 114b of the gate contact 114, thereby reducing the capacitance $C_{GD}$ and then increasing the amplification gain. In the conventional art, a single field plate is disposed in the semiconductor component and its bottom must be higher than the top of the gate contact. However, the single field plate cannot effectively reduce the capacitance $C_{GD}$. Compared to the conventional art, some embodiments of the present disclosure reduce the height of the top of the field plate 124 to be lower than the top of the gate contact 114, thereby reducing more capacitance $C_{GD}$.

The field plate 126 may reduce the electric field peak of the conductive structures (e.g., the gate contact 114, the source contact 110, the field plate 124, and the drain contact 112). More specifically, the field plate 126 may cover the side 114b of the gate contact 114 to reduce the electric field peak here, may cover the side 124a of the field plate 124 to reduce the electric field peak here, and may cover the side 124b of the field plate 124 to reduce the electric field peak, and may cover the side 112a of the drain contact 112 to reduce the electric field peak here. Compared to the arrangement of the single field plate in the conventional art, some embodiments of the present disclosure provide the field plate 126 to reduce the electric field peaks on both sides of the field plate 124.

The field plate 124 may evenly distribute an electric field among the conductive structures (such as the gate contact 114, the source contact 110, and the drain contact 112), improve the resistance to voltage, and allow the voltage to be smoothly released, thereby improving the reliability of the device. The field plate 126 may evenly distribute an electric field among the conductive structures (such as the gate contact 114, the source contact 110, the field plate 124, and the drain contact 112), improve the resistance to voltage, and allow the voltage to be smoothly released, thereby improving the reliability of the device.

In some embodiments, there is at least one passivation layer 152 (e.g., the passivation layer 152 and the passivation layer 154) among the field plate 124, and/or the field plate 126 and the conductive structures. Such a configuration can make the distance between the conductive structures smaller and avoid an increase in resistance.

Figure 2:
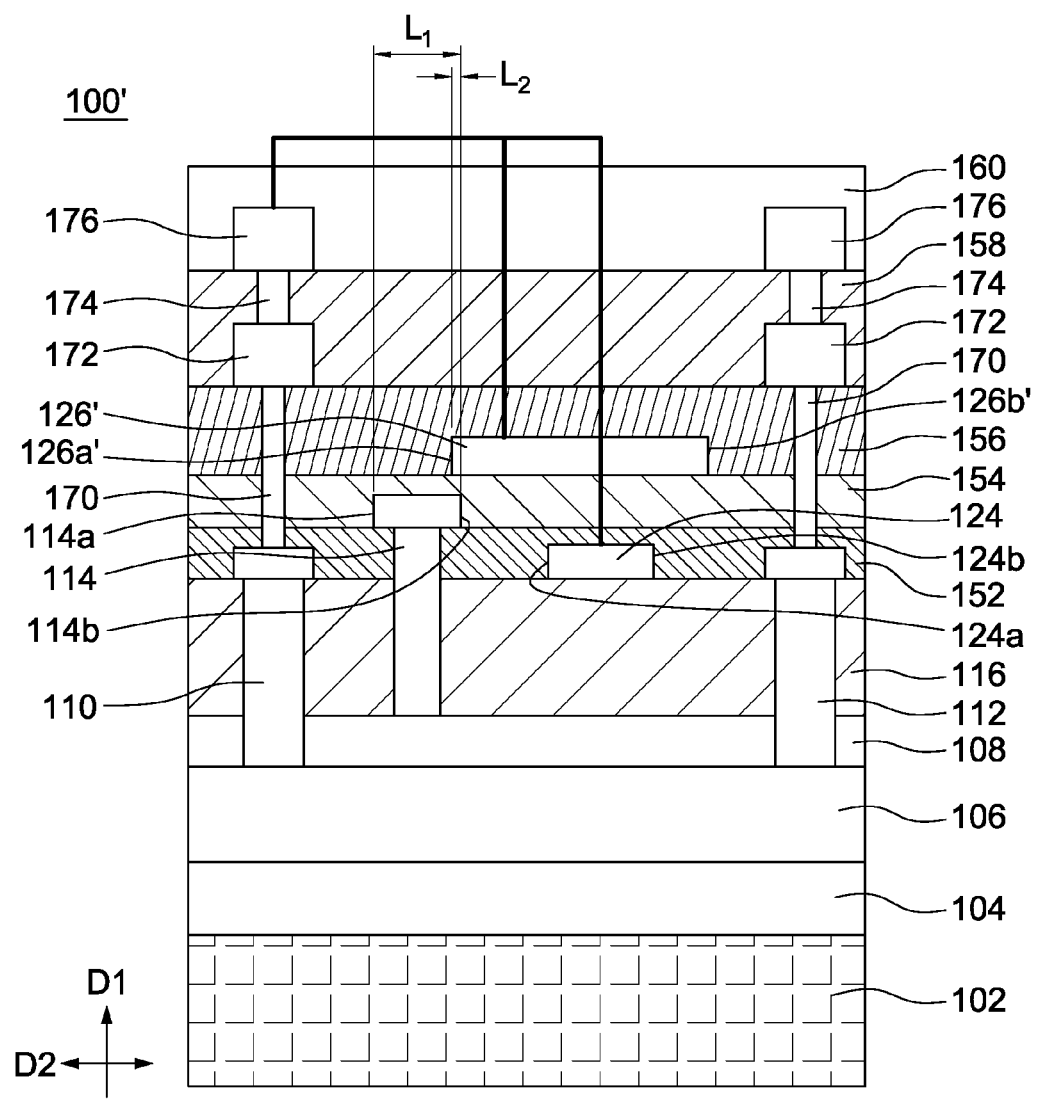
FIG. 2 shows a sectional view of a semiconductor component according to some embodiments of the present disclosure.

FIG. 2 shows a semiconductor component 100' according to some embodiments of the present disclosure.

The semiconductor component 100' shown in FIG. 2 is similar to the semiconductor component 100 shown in FIG. 1, and one of the differences is that a field plate 126' of the semiconductor component 100' extends beyond the side 114b of the gate contact 114.

As shown in FIG. 2, a side 126a' of the field plate 126' extends beyond the side 114b of the gate contact 114. In some embodiments, a length $L_2$ of the side 126a' of the field plate 126' extending beyond the side 114b of the gate contact 114, is 5%-100% of the width $L_1$ of the gate contact 114.

With the above configuration, the electric field peak around the side 114b of the gate contact 114 may be effectively reduced.

Figure 3:
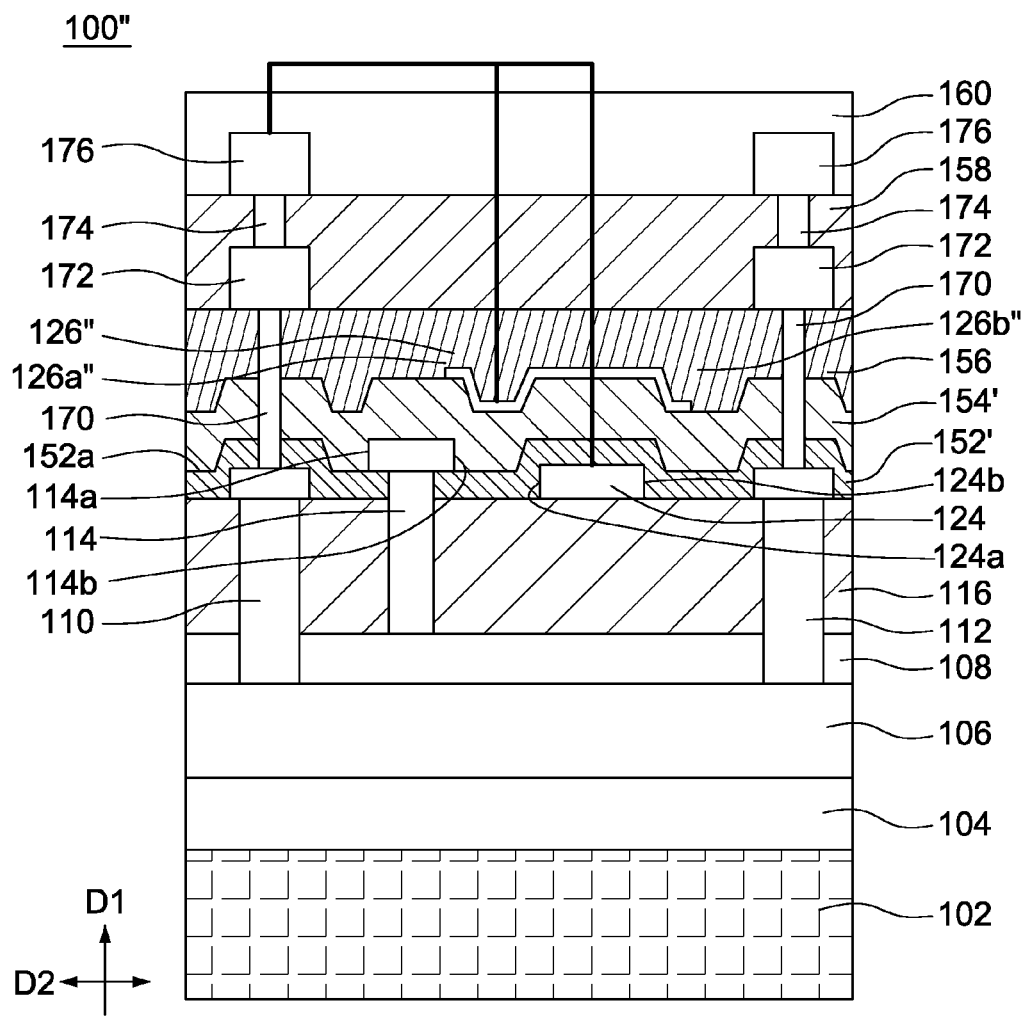
FIG. 3 shows a sectional view of a semiconductor component according to some embodiments of the present disclosure.

FIG. 3 shows a semiconductor component 100" according to some embodiments of the present disclosure.

The semiconductor component 100" shown in FIG. 3 may be the same as or similar to the semiconductor component 100 shown in FIG. 1 and the semiconductor component 100' shown in FIG. 2. One of the differences is that a recess is formed between a first side 126a" and a side 126b" of a field plate 126" of the semiconductor component 100".

As shown in FIG. 3, the recess is formed between the side 126a" and the side 126b" of the field plate 126". In some embodiments, the recess is between the side 114b of the gate contact 114 and the side 124a of the field plate 124. In some embodiments, the internal width of the recess is 0.2-1 μm. In some embodiments, the outer width of the recess is 0.3-1.2 μm. In some embodiments, the depth of the recess is less than 650 nm. In some embodiments, a distance from the recess of the field plate 126" to the surface of the III-V layer 108 is 50-300 nm. It should be noted that the values such as length, width, and distance described in the present disclosure are only exemplary, and the present disclosure is not limited to this. In some embodiments, these values may be adjusted according to the actual applications of the present disclosure without departing from the spirit of the present disclosure. The design that the field plate 126" has the recess may simplify the process because during the formation of the passivation layer 152', the passivation layer 152' may form a recess region 152a due to the rise and fall of the tops of the source contact 110, the drain contact 112, and the field plate 124. During the formation of the field plate 126", a recess may be formed conformally. In some embodiments, the closer the recess of the field plate 126" is to the doped III-V layer 108, the more it can affect the 2DEG region and change the distribution of the 2DEG. More specifically, the closer the recess of the field plate 126" is to the doped III-V layer 108, the more it can reduce the 2DEG density of the side 114b of the gate contact 114, thereby reducing the parasitic capacitance $C_{GD}$ and then increasing the amplification gain.

FIG. 4A, FIG. 4B, FIG. 4C, FIG. 4D, FIG. 4E, FIG. 4F, FIG. 4G, FIG. 4H, and FIG. 4I show several operations for manufacturing a semiconductor component according to some embodiments of the present disclosure. Although FIGS. 4A to 4I depict several operations for manufacturing a semiconductor component 100, similar operations may also be configured to manufacture a semiconductor component 100' or 100".

Figure 4A:
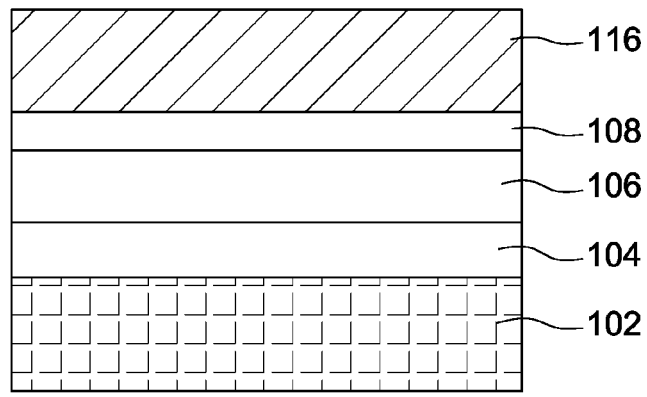
FIG. 4A, FIG. 4B, FIG. 4C, FIG. 4D, FIG. 4E, FIG. 4F, FIG. 4G, FIG. 4H, and FIG. 4I show several operations for manufacturing a semiconductor component according to some embodiments of the present disclosure.

Referring to FIG. 4A, firstly, a substrate 102 is provided. Next, a buffer layer 104, a III-V layer 106, a doped III-V layer 108, and a passivation layer 116 are formed on the substrate 102. In some embodiments, the doped III-V layer 108 is located on the III-V layer 106. The buffer layer 104, the III-V layer 106, and the doped III-V layer 108 may be, for example, in epitaxial growth via metal organic chemical vapor deposition (MOCVD) or formed via other suitable deposition steps. The passivation layer 116 may be formed by CVD, high density plasma (HDP) CVD, spin-on, sputtering, and the like.

Figure 4B:
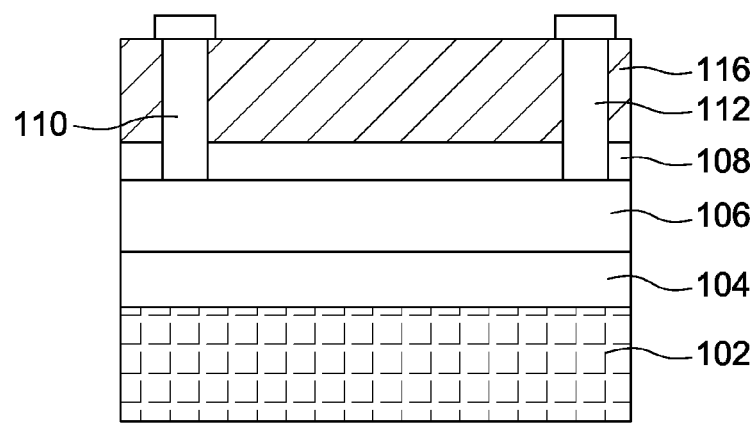

Referring to FIG. 4B, after the passivation layer 116 is formed, a source contact 110 and a drain contact 112 are formed. Through one or more etching processes, a portion of the passivation layer 116 and a portion of the doped III-V layer 108 are removed to form an opening. After the opening is formed, a conductive material may be filled into the opening by the deposition steps such as CVD, PVD, and electroplating. In some embodiments, after the material is filled into the opening, the deposited material is etched again through a photomask to form a required electrode structure, so as to form the source contact 110 and the drain contact 112, and the source contact 110 and the drain contact 112 are in contact with the III-V layer 106. The source contact 110 and the drain contact 112 may be formed by sputtering, physical vapor deposition, or other suitable processes. In some embodiments, the conductive material (such as the source contact 110 and the drain contact 112) and the III-V layer 106 will form an intermetallic compound through rapid thermal annealing (RTA), thereby forming ohmic contacts.

Figure 4C:
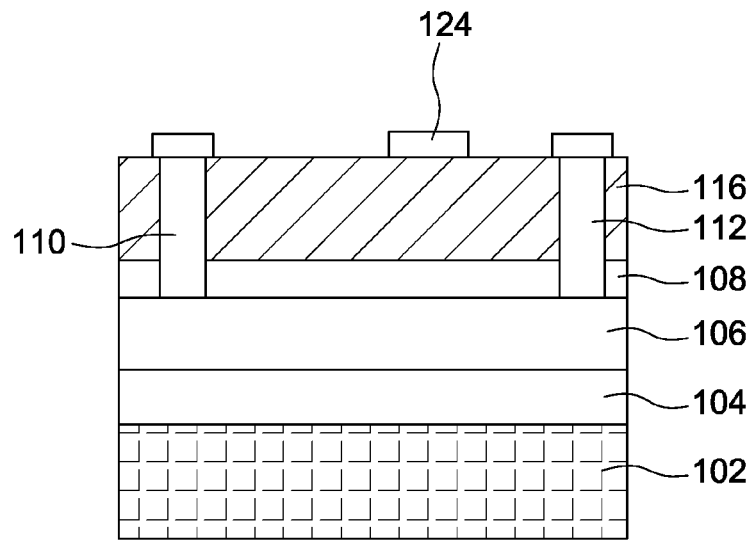

Referring to FIG. 4C, after the source contact 110 and the drain contact 112 are formed, a field plate 124 is formed. However, in some embodiments, the field plate 124, the source contact 110, and/or the drain contact 112 may be formed by the same process. In the embodiment of FIG. 4C, the field plate 124, the source contact 110, and/or the drain contact 112 may be formed by different processes. In addition, the field plate 124 may be patterned by photolithography, etching, and other processes. In some embodiments, the field plate 124 has a side 124a and a side 124b.

Figure 4D:
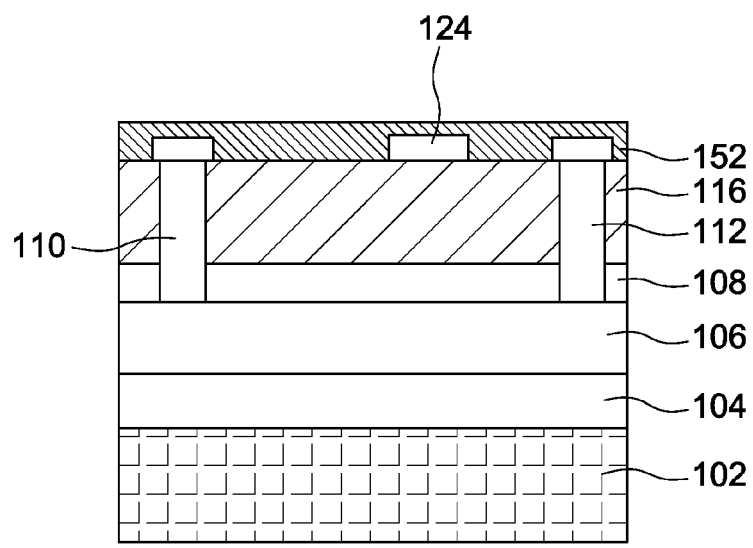

Referring to FIG. 4D, a passivation layer 152 is deposited on the passivation layer 116. In some embodiments, the passivation layer 152 may be deposited by the following manners: CVD, HDP CVD, spin-on, sputtering, etc. Next, the surface of the passivation layer 152 may be treated with chemical-mechanical planarization (CMP).

Figure 4E:
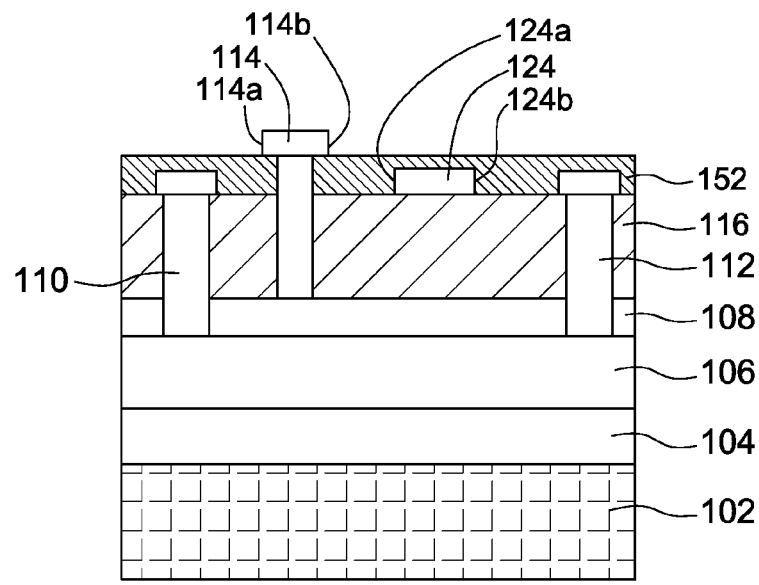

Referring to FIG. 4E, after the passivation layer 152 is formed, a gate contact 114 is formed directly on the doped III-V layer 108. In some embodiments, the gate contact 114 has a side 114a and a side 114b both away from the doped III-V layer 108, and the side 124a of the field plate 124 is closer to the gate contact 114 than the side 124b. In some embodiments, the gate contact 114 does not overlap the field plate 124 from its side 114a to its side 114b.

Figure 4F:
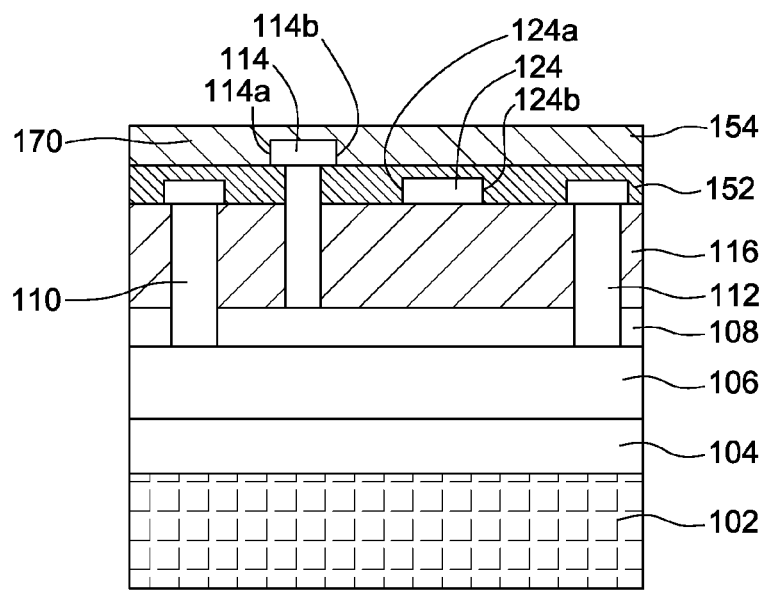

Referring to FIG. 4F, after the gate contact 114 is formed, a passivation layer 154 is deposited on the passivation layer 152. In some embodiments, the passivation layer 154 may be deposited by the following manners: CVD, HDP CVD, spin-on, sputtering, etc. Next, the surface of the passivation layer 154 is treated with CMP.

Figure 4G:
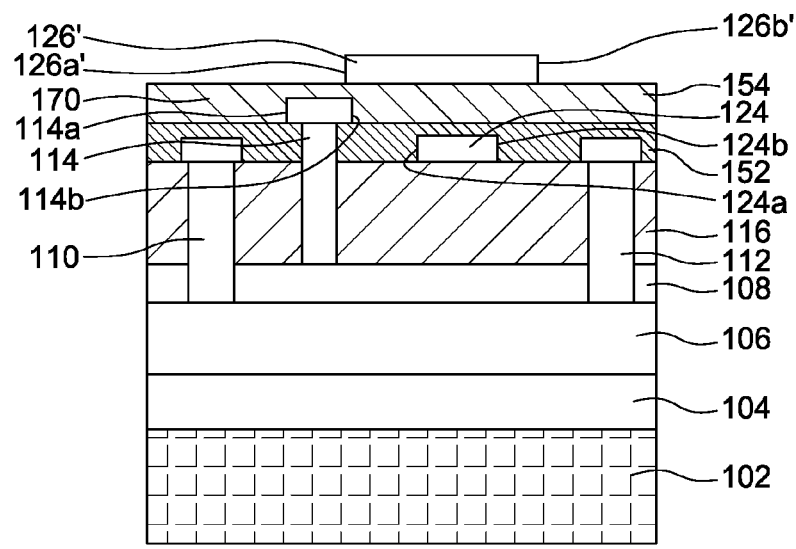

Referring to FIG. 4G, after the passivation layer 154 is formed, a field plate 126 is formed. The field plate 126 may be patterned by photolithography, etching, and other processes. In some embodiments, the field plate 126 has a side 126a and a side 126b, and the side 126a of the field plate 126 is closer to the gate contact 114 than the side 126b. In some embodiments, the field plate 124 is closer to the doped III-V layer 108 than the field plate 126 and the side 114a and the side 114b of the gate contact 114. In some embodiments, the side 126a of the field plate 126 extends beyond the side 124a of the field plate 124, but does not extend beyond the side 114b of the gate contact 114 (corresponding to the embodiment of FIG. 1). In some embodiments, the side 126a of the field plate 126 extends beyond the side 114b of the gate contact 114 (corresponding to the embodiment of FIG. 2). In some embodiments, a length of the side 126a of the field plate 126 extending beyond the side 114b of the gate contact 114 is 5%-100% of the width of the gate contact 114.

Figure 4H:
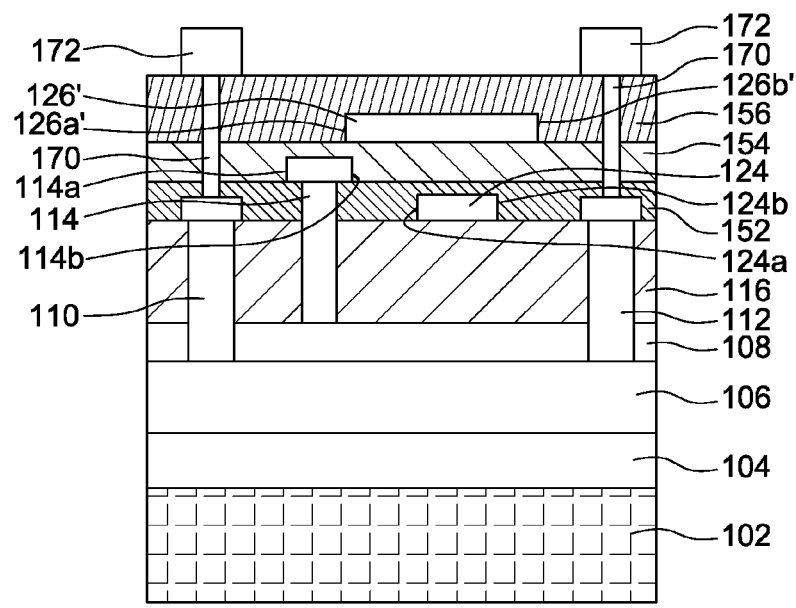

Referring to FIG. 4H, after the field plate 126 is formed, operations of manufacturing the semiconductor components 100 and 100' further include forming a passivation layer 156 to cover the field plate 126 and forming an interconnect structure 170 passing through the passivation layers 156 to 152 and connected to the source contact 110 and drain contact 112.

In some embodiments, the operations of manufacturing the semiconductor components 100 and 100' further include forming a metal layer 172 on the passivation layer 156. In some embodiments, the passivation layer 156 may be deposited by the following manners: CVD, HDP CVD, spin-on, sputtering, etc. Next, the surface of the passivation layer 156 is treated with CMP.

In some embodiments, the operations of manufacturing the semiconductor components 100 and 100' further includes forming a passivation layer 158 to cover the metal layer 172. In some embodiments, the passivation layer 158 may be deposited by the following manners: CVD, HDP CVD, spin-on, sputtering, etc. Next, the surface of the passivation layer 158 is treated with CMP.

Figure 4I:
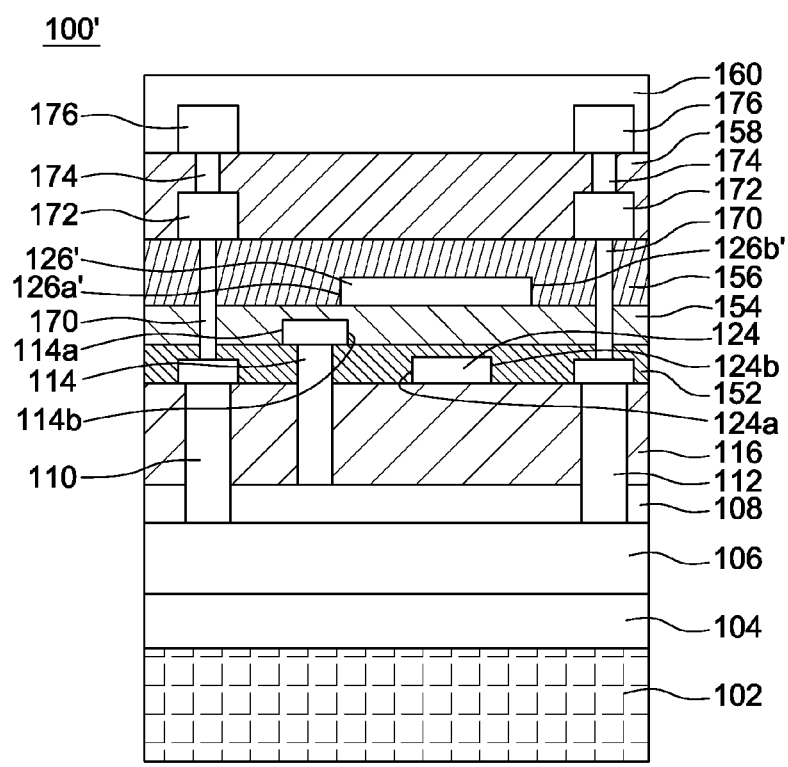

Referring to FIG. 4I, after the passivation layer 158 is formed, in some embodiments, the process flow further includes forming a conductive via 174 passing through the passivation layer 158 and connected to the metal layer 172 or the interconnect structure 170. In some embodiments, the operations of manufacturing the passivation layer 158 of the semiconductor component further includes forming a metal layer 176 connected to the conductive via 174, and forming a passivation layer 160 to cover the metal layer 176. In some embodiments, the passivation layer 160 may be deposited by the following manners: CVD, HDP CVD, spin-on, sputtering, etc. Next, the surface of the passivation layer 160 is treated with CMP.

FIG. 5A, FIG. 5B, FIG. 5C, FIG. 5D, FIG. 5E, FIG. 5F, FIG. 5G, FIG. 5H, and FIG. 5I show several operations for manufacturing a semiconductor component 100" of FIG. 3.

Figure 5A:
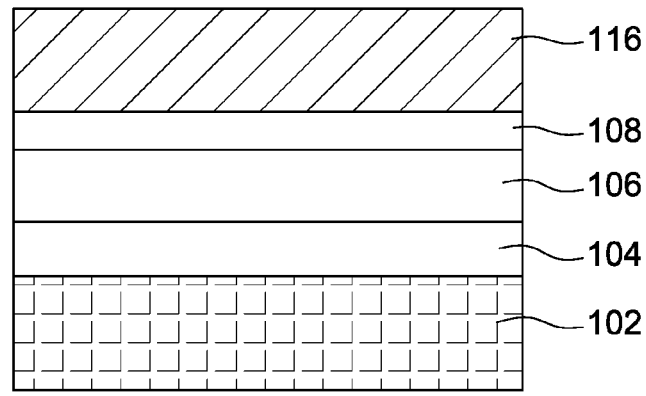
FIG. 5A, FIG. 5B, FIG. 5C, FIG. 5D, FIG. 5E, FIG. 5F, FIG. 5G, FIG. 5H, and FIG. 5I show several operations for manufacturing a semiconductor component according to some embodiments of the present disclosure.
Figure 5B:
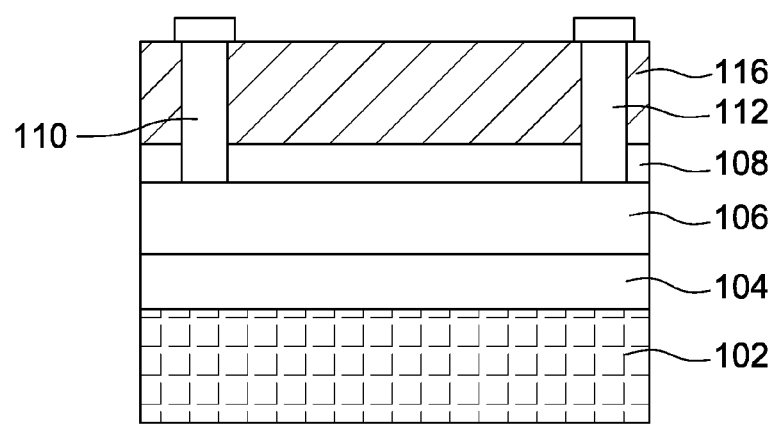
Figure 5C:
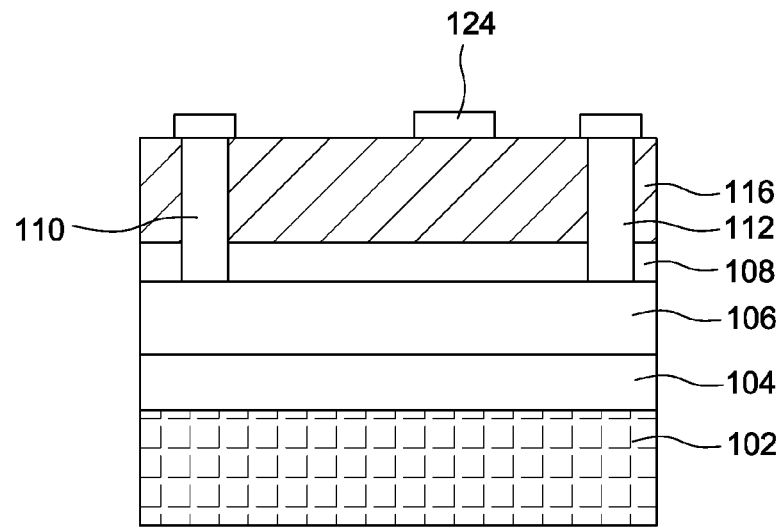

The operations in FIGS. 5A to 5C are generally the same as those in FIGS. 4A to 4C.

Figure 5D:
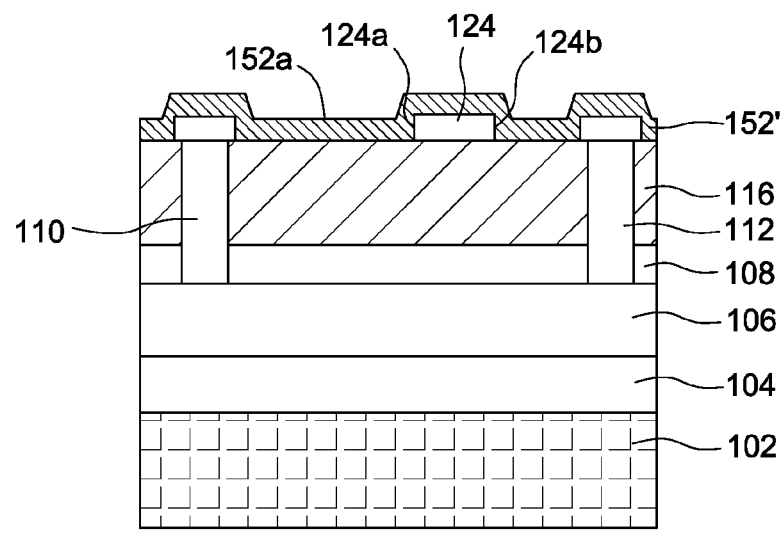

Referring to FIG. 5D, a passivation layer 152' is deposited on the passivation layer 116. In some embodiments, the passivation layer 152' may be deposited by the following manners: CVD, high density plasma (HDP) CVD, spin-on, sputtering, etc. In the present embodiment, the passivation layer 152' forms a recess region 152a along the surfaces of the field plate 124, the source contact 110, and/or the drain contact 112.

Figure 5E:
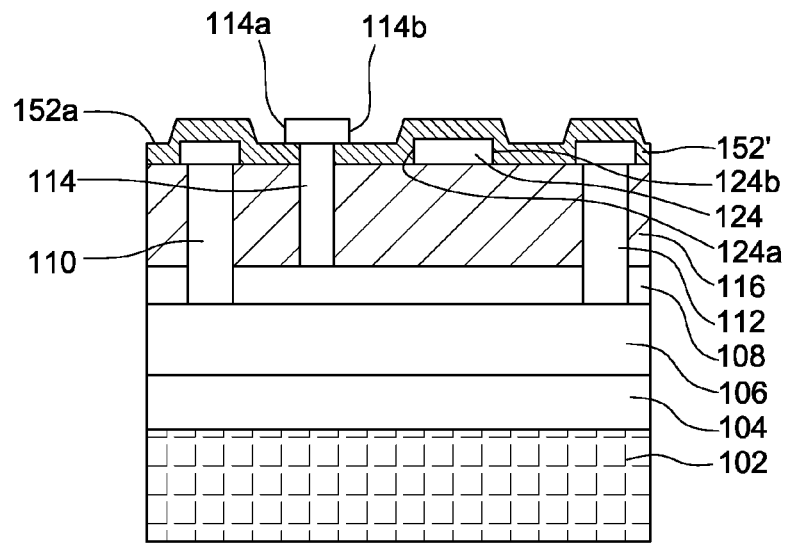

Referring to FIG. 5E, after the passivation layer 152' is formed, a gate contact 114 is formed directly on the doped III-V layer 108. In some embodiments, the gate contact 114 has a side 114a and a side 114b both away from the doped III-V layer 108, and the side 124a of the field plate 124 is closer to the gate contact 114 than the side 124b.

Figure 5F:
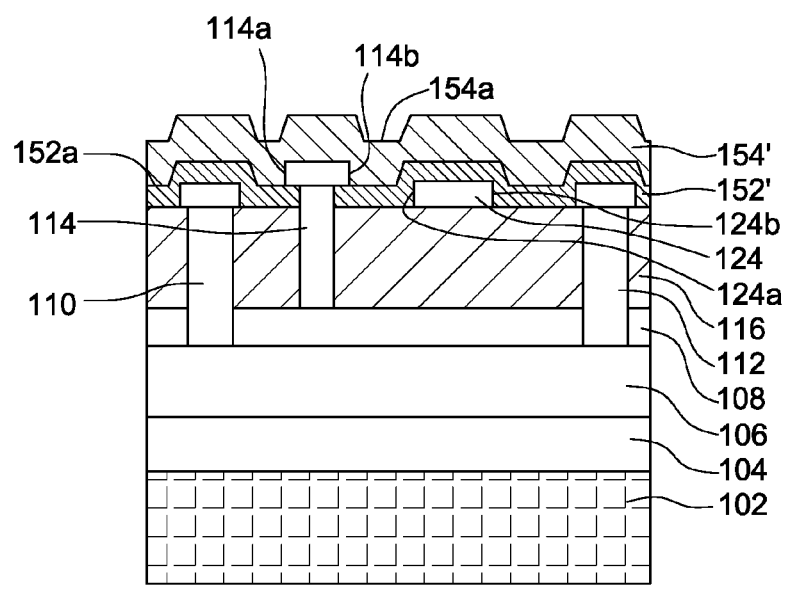

Referring to FIG. 5F, after the gate contact 114 is formed, a passivation layer 154' is deposited on the passivation layer 152'. In the present embodiment, the passivation layer 154' forms a recess region 154a along the surfaces of the field plate 124, the source contact 110, the drain contact 112, and/or the recess region 152a.

Figure 5G:
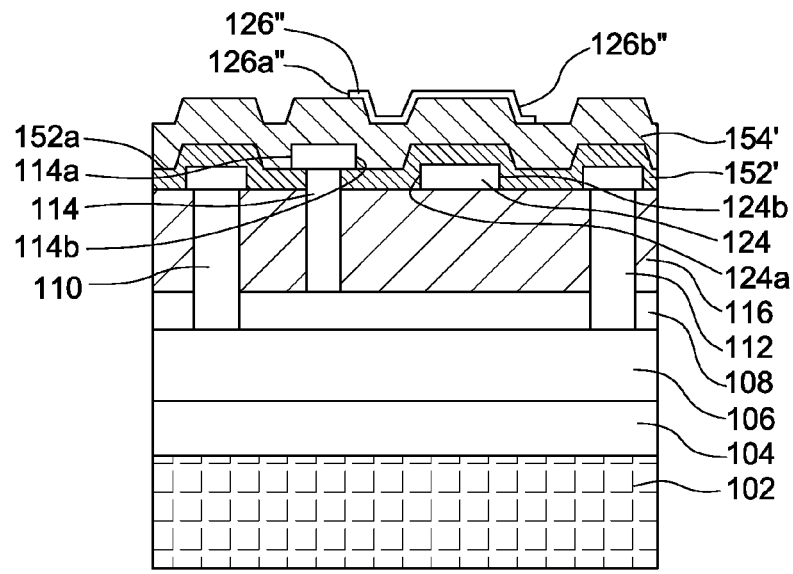

Referring to FIG. 5G, after the passivation layer 154' is formed, a field plate 126" is formed. The field plate 126" may be patterned by photolithography, etching, and other processes. In some embodiments, the field plate 126" has a side 126a" and a side 126b", and the side 126a" of the field plate 126" is closer to the gate contact 114 than the side 126b". In some embodiments, the field plate 124 is closer to the doped III-V layer 108 than the field plate 126" and the side 114a and the side 114b of the gate contact 114. In some embodiments, the side 126a" of the field plate 126" extends beyond the side 124a of the field plate 124. In some embodiments, the side 126a" of the field plate 126" extends beyond the side 114b of the gate contact 114. In some embodiments, a length of the side 126a" of the field plate 126" extending beyond the side 114b of the gate contact 114 is 5%-100% of the width of the gate contact 114. In some embodiments, a recess is formed between the side 126a" and the side 126b" of the second field plate 126". The recess is between the side 114b of the gate contact 114 and the first side 124a of the field plate 124. In some embodiments, the recess has the width of 0.2-1 μm, and has the depth less than 650 nm. In some embodiments, a distance from the recess of the field plate 126" to the surface of the III-V layer 108 is 50-300 nm.

Figure 5H:
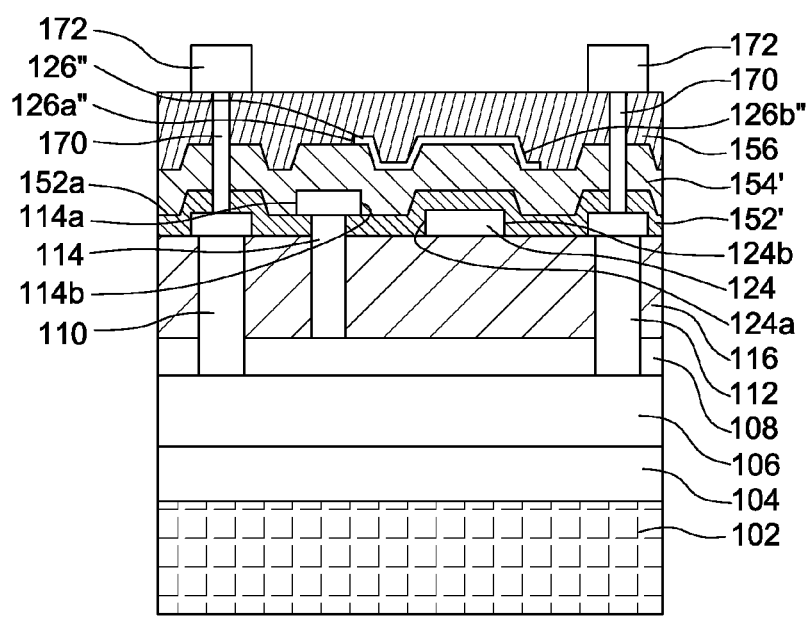

Referring to FIG. 5H, after the field plate 126" is formed, operations of manufacturing the semiconductor components 100, 100', and 100" further include forming a passivation layer 156 to cover the field plate 126", and forming an interconnect structure 170 passing through the passivation layers 156 to 152' and connected to the source contact 110 and the drain contact 112. In some embodiments, the passivation layer 156 may be deposited by the following manners: CVD, HDP CVD, spin-on, sputtering, etc. Next, the surface of the passivation layer 156 may be treated with chemical-mechanical planarization (CMP).

In some embodiments, the operations of manufacturing the semiconductor component 100" further include forming a metal layer 172 on the passivation layer 156.

Figure 5I:
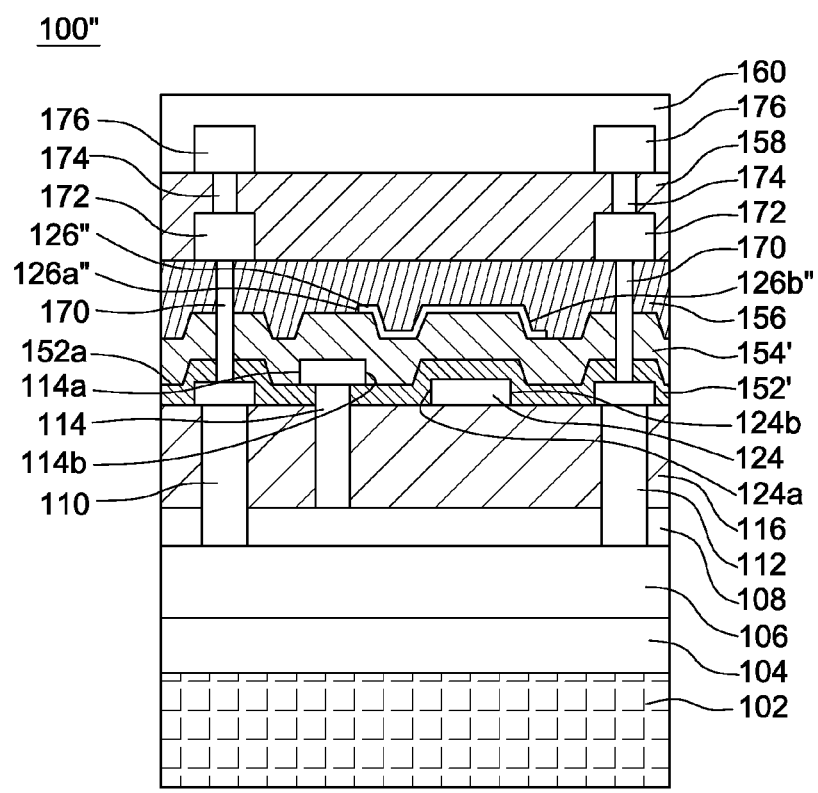

The operations of FIG. 5I are similar to those of FIG. 4I, so similar descriptions are not repeated.

The recess region generated by the formation of the passivation layer 152' is reserved on purpose by virtue of the operations of FIGS. 5A to 5I, so that the subsequently formed field plate 126" has a recess. By the above operations, the operation of treating and polishing the surfaces of the passivation layers 152 and 154 with CMP may be omitted at least. In addition, the recess of the field plate 126" can have a relatively great influence on a two-dimensional electron gas (2DEG) region, and can change the distribution of 2DEG, thereby reducing the parasitic capacitance $C_{GD}$ and thus increasing the amplification gain.

In addition, in some embodiments, the recess region 152a of the passivation layer 152' may be further etched to make the recess region of the field plate 126" deeper. For example, after the passivation layer 152' is deposited on the passivation layer 116 with reference to FIG. 5D, the passivation layer 152' may be etched at a position corresponding to the recess region of the field plate 126". Alternatively, after the gate contact 114 is formed with reference to FIG. 5E, the passivation layer 152' may be etched at a position corresponding to the recess region of the field plate 126". In some other embodiments, the recess region 154a of the passivation layer 154' may also be further etched to make the recess region of the field plate 126" deeper. For example, referring to FIG. 5F, after the passivation layer 154' is deposited on the passivation layer 152', the passivation layer 154' may be etched at a position corresponding to the recess region of the field plate 126". The present disclosure relates to the semiconductor components and the manufacturing methods thereof, and more particularly to the radio frequency semiconductor component with the field plates and a manufacturing method of the radio frequency semiconductor component, which has the advantages of effectively reducing the capacitance $C_{GD}$, simplifying the process, etc. However, the semiconductor components shown in the present disclosure include, for example, but are not limited to, a radio frequency semiconductor component or a power component, etc.

As used herein, for ease of description, space-related terms such as "under", "below", "lower portion", "above", "upper portion", "lower portion", "left side", "right side", and the like may be used herein to describe a relationship between one component or feature and another component or feature as shown in the figures. In addition to orientation shown in the figures, space-related terms are intended to encompass different orientations of the device in use or operation. An apparatus may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used in the present disclosure, terms "approximately", "basically", "substantially", and "about" are used for describing and explaining a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges disclosed in the present disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the present disclosure and features of details are briefly described above. The embodiments described in the present disclosure may be easily used as a basis for designing or modifying other processes and structures for realizing the same or similar objectives and/or obtaining the same or similar advantages introduced in the embodiments of the present disclosure. Such equivalent construction does not depart from the spirit and scope of the present disclosure, and various variations, replacements, and modifications can be made without departing from the spirit and scope of the present disclosure.

What is claimed is:

1. A semiconductor component (100), comprising:
   a substrate (102);
   a III-V layer (106), disposed on the substrate (102);
   a doped III-V layer (108), disposed on the III-V layer (106);
   a gate contact (114), directly located on the doped III-V layer (108), the gate contact (114) having a first side (114a) and a second side (114b) both away from the doped III-V layer (108);
   a first field plate (124), having a first side (124a) and a second side (124b), the first side (124a) of the first field plate (124) being closer to the second side (114b) of the gate contact (114) than the second side (124b); and
   a second field plate (126), having a first side (126a) and a second side (126b), the first side (126a) of the first field plate (126) being closer to the second side (114b) of the gate contact (114) than the second side (126b), wherein the first field plate (124) is closer to the doped III-V layer (108) than the second field plate (126) and the first side (114a) and the second side (114b) of the gate contact (114).

2. The semiconductor component according to claim 1, wherein the gate contact (114) does not overlap the first field plate (124) from the first side (114a) to the second side (114b).

3. The semiconductor component according to claim 1, wherein the first side (126a) of the second field plate (126) extends beyond the first side (124a) of the first field plate (124).

4. The semiconductor component according to claim 1, wherein the first side (126a) of the second field plate (126) extends beyond the second side (114b) of the gate contact (114).

5. The semiconductor component according to claim 4, wherein a length of the first side (126a) of the second field plate (126) extending beyond the second side (114b) of the gate contact (114) is 5%-100% of the width of the gate contact (114).

6. The semiconductor component according to claim 4, wherein a recess is formed between the first side (126a) and the second side (126b) of the second field plate (126), and the recess is between the second side (114b) of the gate contact (114) and the first side (124a) of the first field plate (124).

7. The semiconductor component according to claim 6, wherein the recess has the width of 0.2-1 μm, and has the depth less than 650 nm.

8. The semiconductor component according to claim 1, further comprising a source contact (110) and a drain contact (112) both disposed on the III-V layer (106).

9. The semiconductor component according to claim 1, further comprising a buffer layer (104) disposed between the substrate (102) and the III-V layer (106).

10. The semiconductor component according to claim 1, further comprising a first passivation layer (116) disposed above the doped III-V layer (108) and below the first field plate (124).

11. The semiconductor component according to claim 10, wherein the first passivation layer (116) partially surrounds the gate contact (114).

12. The semiconductor component according to claim 11, further comprising a second passivation layer (152) disposed on the first passivation layer (116) and covering the first field plate (124), wherein the second passivation layer (152) partially surrounds the gate contact (114) and the first field plate (124).

13. The semiconductor component according to claim 12, further comprising a third passivation layer (154) disposed on the second passivation layer (152) and covering the gate contact (114), wherein the third passivation layer (154) partially surrounds the gate contact (114).

14. The semiconductor component according to claim 13, further comprising a fourth passivation layer (156) disposed on the third passivation layer (154) and covering the second field plate (126), wherein the fourth passivation layer (156) partially surrounds the second field plate (126).

15. A method for forming a semiconductor component (100), comprising:
   providing a substrate (102);
   forming a III-V layer (106) on the substrate (102);
   forming a doped III-V layer (108) on the III-V layer (106);
   forming a first field plate (124) having a first side (124a) and a second side (124b);
   after forming the first field plate (124), directly forming a gate contact (114) on the doped III-V layer (108), the gate contact (114) having a first side (114a) and a second side (114b) both away from the doped III-V layer (108), the first side (124a) of the first field plate (124) being closer to the second side (114b) of the gate contact (114) than the second side (124b); and after forming the gate contact (114), forming a second field plate (126) having a first side (126a) and a second side (126b), the first side (126a) being closer to the second side (114b) of the gate contact (114) than the second side (126b).

16. The method according to claim 15, wherein the gate contact (114) does not overlap the first field plate (124) from the first side (114a) to the second side (114b).

17. The method according to claim 15, wherein the first side (126a) of the second field plate (126) extends beyond the first side (124a) of the first field plate (124).

18. The method according to claim 15, wherein the first side (126a) of the second field plate (126) extends beyond the second side (114b) of the gate contact (114).

19. The method according to claim 18, wherein a length of the first side (126a) of the second field plate (126) extending beyond the second side (114b) of the gate contact (114) is 5%-100% of the width of the gate contact (114).

20. The method according to claim 18, wherein a recess is formed between the first side (126a) and the second side (126b) of the second field plate (126), and the recess is between the second side (114b) of the gate contact (114) and the first side (124a) of the first field plate (124).

21. The method according to claim 20, wherein the recess has the width of 0.2-1 μm, and has the depth less than 650 nm.

22. The method according to claim 15, further comprising forming a source contact (110) and a drain contact (112) on the III-V layer (106).

23. The method according to claim 15, further comprising forming a buffer layer (104) on the substrate (102) before forming the III-V layer (106).

24. The method according to claim 15, further comprising forming a first passivation layer (116) on the doped III-V layer (108) before forming the first field plate (124).

25. The method according to claim 24, further comprising forming a second passivation layer (152) on the first passivation layer (116) and the first field plate (124) after forming the first field plate (124).

26. The method according to claim 25, further comprising forming a third passivation layer (154) on the second passivation layer (152) and the gate contact (114) before forming the second field plate (126).

* * * * *